United States Patent [19]

Seto et al.

[11] Patent Number: 4,689,561
[45] Date of Patent: Aug. 25, 1987

[54] NUCLEAR MAGNETIC RESONANCE SPECTROSCOPY

[75] Inventors: Haruo Seto; Kazuo Furihata; Muneki Ohuchi, all of Tokyo, Japan

[73] Assignee: JEOL Ltd., Tokyo, Japan

[21] Appl. No.: 717,338

[22] Filed: Mar. 29, 1985

[30] Foreign Application Priority Data

Apr. 2, 1984 [JP] Japan .................................. 59-65471

[51] Int. Cl.[4] ........................................... G01R 33/08
[52] U.S. Cl. .................................................... 324/307
[58] Field of Search ........................ 324/307, 311, 312

[56] References Cited

PUBLICATIONS

Seto, H. et al, "Structure Analysis of Natural Products by Nuclear Magnetic Resonance Spectroscopy", JEOL News, Analytical Instrumentation, vol. 21, No. 1, Feb. 15, 1985.
"Application of Long Range J C—H Resolved 2d Spectroscopy (LRJR) in Structural Elucidation of Natural Products, The Structure of Oxirapentyn, (Reprint from Tetrahedron Letters, vol. 25, No. 3, pp. 337-340), by H. Seto et al.

Primary Examiner—Michael J. Tokar
Assistant Examiner—Francis J. Jaworski
Attorney, Agent, or Firm—Webb, Burden, Robinson & Webb

[57] ABSTRACT

The present invention provides a nuclear magnetic resonance spectroscopy that permits one to see changes in spectra without the use of long-range coupling even if the obtained resonance lines split into complex multiplet patterns. The spectrometry comprises the steps of: (a) applying a pulse train of radio-frequency irradiation to a nucleus under observation; (b) applying weak radio-frequency irradiation having a frequency equal to the resonance frequency either of an unobserved nucleus coupled to the observed nucleus or of the observed nucleus in synchronism with the application of the pulse train; (c) receiving the free induction decay signal produced after the application of the pulse train and storing it in a memory; (d) applying a pulse train of radio-frequency irradiation to the observed nucleus; (e) receiving the free induction decay signal produced after the application of the pulse train in step (d) and either adding it to the free induction decay signal stored in step (c) or substracting it from the previously stored signal; and (f) taking the Fourier transform of the free induction decay signal obtained by the arithmetic operation in step (e).

9 Claims, 22 Drawing Figures

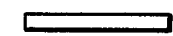
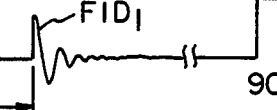
Fig. 2 (c")
Fig. 2 (c')
Fig. 2 (c)
Fig. 2 (b)
Fig. 2 (a)
90°  180°  τ  FID₁    90°  180°  τ  FID₂
Fig. 3 (a)  ON/OFF
Fig. 3 (b)  ON/OFF
Fig. 3 (c)  ON/OFF
Fig. 3 (d)  ON/OFF
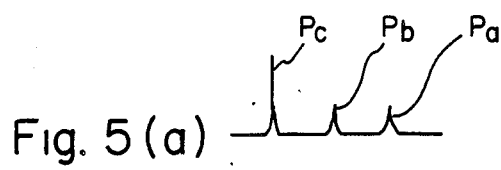
Fig. 5 (a)
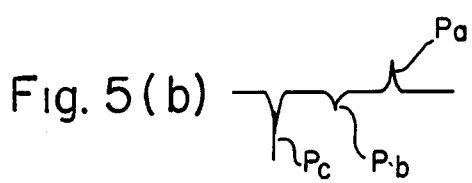
Fig. 5 (b)
Fig. 4  $C_A H_A - C_C - C_B H_B -$
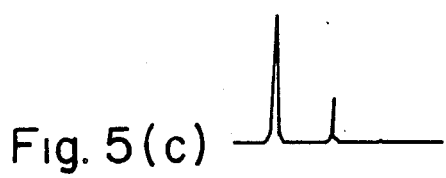
Fig. 5 (c)
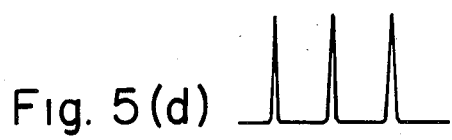
Fig. 5 (d)

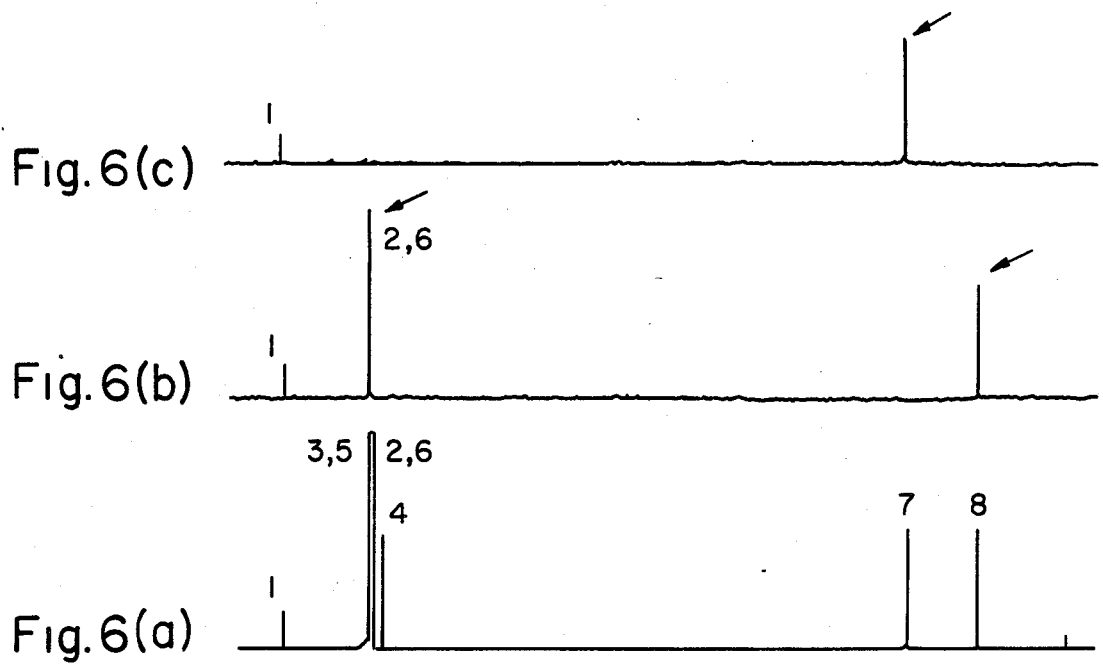
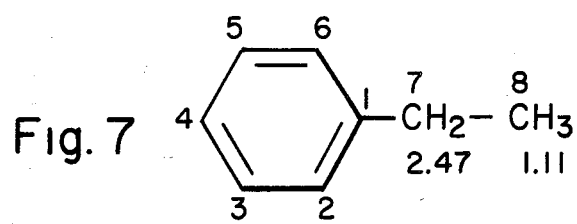
Fig. 7
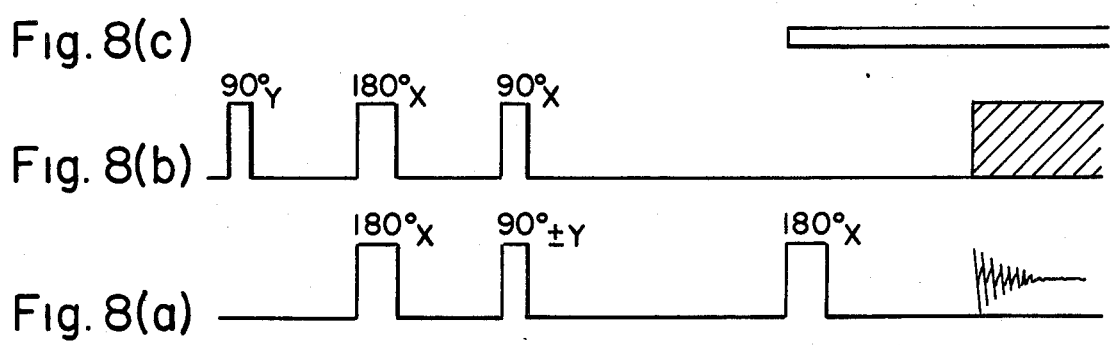

NUCLEAR MAGNETIC RESONANCE SPECTROSCOPY

BACKGROUND OF THE INVENTION

The present invention relates to a nuclear magnetic resonance spectroscopy method and to a nuclear magnetic resonance spectrometer adapted to detect selectively the existence of weak, or long-range, couplings between carbon and hydrogen nuclei.

Determination of the number of hydrogen atoms coupled to each carbon from a carbon-13 NMR spectrum and subsequent elucidation of spin coupling between the hydrogen and carbon nuclei are indispensible for analysis of the structure of organic compounds. In carbon-13 NMR spectra where the carbons are left coupled to the hydrogen nuclei, each carbon resonance splits into a multiplet due to the spin coupling with hydrogen nuclei. Spin couplings of this kind are classified as direct spin coupling that is produced between directly bonded carbon and hydrogen and weak, or long-range, coupling that is observed between carbon and hydrogens which are separated by more than two or three chemical bonds.

Methods which are now available to elucidate such a long-range coupling are (1) long-range selective proton decoupling (LSPD) spectroscopy and (2) long-range C-H coupling resolved two-dimensional spectroscopy (resolution). In the long-range selective proton decoupling, a hydrogen nucleus which corresponds to a certain peak appearing in a proton NMR spectrum is decoupled by radio-frequency irradiation. Under this condition, a carbon-13 NMR spectrum is obtained, and this is compared with another spectrum obtained under non-decoupled condition to examine the difference. The LSPD is the fundamental method for interpreting carbon resonance lines.

The LSPD causes each resonance line to be split into a very complex multiplet pattern when a single carbon is spin-coupled to too many hydrogens, as often encountered in saturated compounds. Under this condition, even if the hydrogen at one location is decoupled, the change produced thereby can be hardly observed.

The above-mentioned drawback with the LSPD can be solved by the use of the long-range C-H coupling resolution which is a kind of two-dimensional NMR and able to resolve resonance lines attributed to weak, long-range couplings into simpler and clearer splitting patterns. This long-range C-H resolution is described in Tetrahedron Letters, Vol. 25, No. 3, pp. 337-340, 1984. However, this method has various disadvantages. First, it requires very long time for measurement. A reduction in the signal-to-noise ratio necessarily results due to the presentation of power spectrum using special window functions. A memory having a large storage capacity is needed. Further, a computer program for two-dimensional NMR is necessitated. Thus, the long-range C-H resolution is not easy to perform.

SUMMARY OF THE INVENTION

In view of the foregoing difficulties with the prior art techniques, it is the main object of the present invention to provide a nuclear magnetic resonance spectroscopy method which permits one to observe the changes of spectra, without making use of long-range coupling constant, even when resonance lines split into complex multiplet patterns.

The nuclear magnetic resonance spectrometry method according to the present invention comprises the steps of: (a) applying a pulse train of radio-frequency magnetic field to a nucleus under observation; (b) applying weak radio-frequency magnetic field having the resonance frequency of an unobserved nucleus coupled to the observed nucleus in synchronism during the pulse train; (c) detecting the free induction decay signal produced after the application of the pulse train and storing it in a memory; (d) applying a pulse train of radio-frequency magnetic field to the observed nucleus; (e) receiving the free induction decay signal produced after the application of the pulse train in step (d) and either adding it to the free induction decay signal stored in step (c) or subtracting it from the previously stored signal; and (f) taking the Fourier transform of the free induction decay signal obtained by the arithmetic operation in step (e).

Other objects and features of the invention will appear in the course of the description that follows.

BRIEF DESCRIPTION OF THE DRAWINGS

FIGS. 2(a), 2(b), 2(c), 2(c') and 2(c'') are representations of pulse sequences for use in the invention;

FIGS. 3(a) to 3(d) are timing diagrams for illustrating the operation of the spectrometer shown in FIG. 1;

FIG. 4 shows the structural formula of a compound;

FIG. 5 shows spectra, for illustrating a change in a spectrum as well as the difference between two spectra;

FIGS. 6(a) to 6(c) show spectra for illustrating a measurement made according to the present invention;

FIG. 7 shows the structural formula of ethylbenzene; and

FIGS. 8(a) to 8(c) show other pulse trains used for the present invention.

PREFERRED EMBODIMENTS OF THE INVENTION

Figure 1:
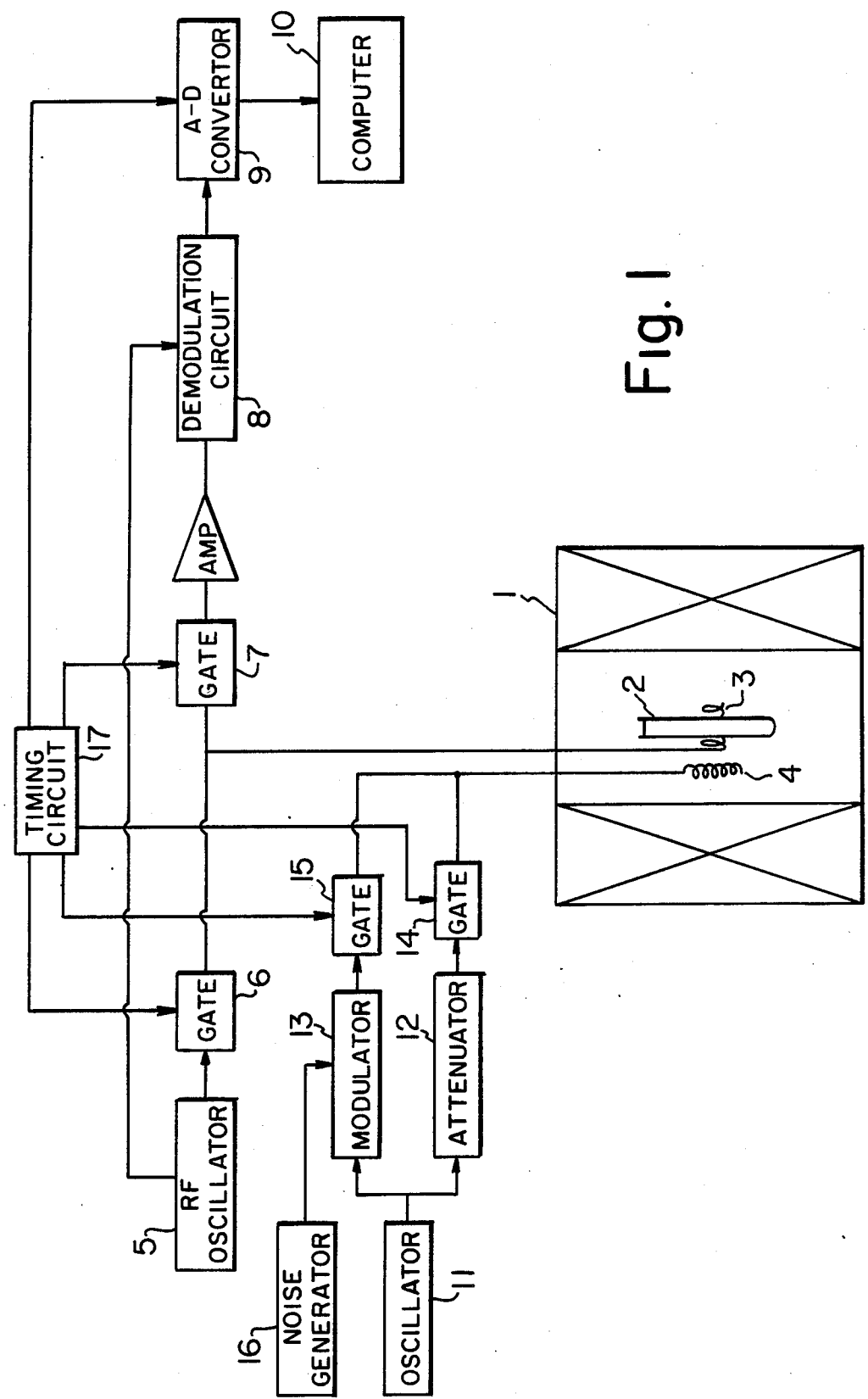
FIG. 1 is a block diagram of a nuclear magnetic resonance spectrometer for carrying out the present invention.

FIG. 1 is a block diagram of a nuclear magnetic resonance spectrometer embodying the present invention. This spectrometer includes a magnet 1 for producing a static magnetic field, a sample tube 2 placed in the magnetic field, a transmitter coil 3 for producing exciting radiation, and a transmitter coil 4 used for decoupling purposes. The exciting radio-frequency wave generated by an RF oscillator 5 is fed via a gate 6 to the coil 3 as RF pulses. The resulting resonance induces a resonance signal in the coil 3. This signal is picked up via a gate 7 and fed to a demodulation circuit 8, where it is demodulated, producing a free induction decay signal. This signal is supplied via an analog-to-digital converter 9 to a computer 10, where it is stored in its memory and added to the previously stored data for accumulation. Further, the signal undergoes Fourier transformation.

An RF oscillator 11 produces a decoupling radio-frequency wave, which is supplied to an attenuator 12 and a modulator 13. The signal attenuated by the attenuator 12 is then furnished to the transmitter coil 4 via a gate 14. The signal modulated by the modulator 13 is then given also to the transmitter coil 4 via a gate 15. The modulator 13 is supplied with noise signals from a noise generator 16. The gates 6, 7, 14, and 15 are enabled and disabled by a timing circuit 17. Also, the A/D converter 9 samples its input signal under the control of the timing circuit 17.

The operation of the spectrometer constructed as described above is now described by referring to FIGS. 2 and 3. FIG. 2 shows an example of pulse sequence for use in the present invention. FIG. 2(a) shows a pulse train applied to $^{13}C$ under observation. FIG. 2(b) shows the time intervals during which strong, noise-decoupling RF irradiation is applied to hydrogen nuclei. FIG. 2(c) shows the time interval during which selectively decoupling, weak RF irradiation is applied to hydrogen nuclei.

FIG. 3 is a timing diagram for illustrating the operation of the spectrometer. The signal coming from the timing circuit 17 enables and disables the gate 6 during the time intervals shown in FIG. 3(a). Thus, 90° pulses and 180° pulses for excitation of $^{13}C$ are applied to the sample at intervals as shown in FIG. 2(a). A free induction decay signal (echo signal) FID1 which is produced when period $\tau$ elapses since the application of such a 180° pulse is fed via the gate 7 to the A/D converter 8, where it is sampled while the gate 7 is enabled. The on/off period of gate 7 is shown by FIG. 3(b). The sampled signal is provided to the computer 9, and then it is stored in the memory. A similar measurement is made after a lapse of appropriate time to obtain a free induction decay signal FID2.

Meanwhile, the oscillator 11 applies sufficiently strong, decoupling RF irradiation whose frequency is broadened by noise modulation to the sample via the gate 15, which is enabled during the time intervals shown in FIG. 3(c), during the time intervals shown in FIG. 2(b). Further, weak RF irradiation which decouples only a certain hydrogen nucleus is applied to the sample during the time intervals shown in FIG. 2(c) via the gate 14 that is enabled during the time interval shown in FIG. 3(d).

The RF irradiation for excitation of carbon nuclei and the noisemodulated RF radiation are applied in exactly the same manner with both the first and second measurements, which are made in the sequence indicated in FIG. 2. However, for the first measurement the weak RF irradiation which decouples only a certain hydrogen nucleus is applied during the time period between the application of a 90° and a 180° pulse as shown in FIG. 2(c), (c'), or (c''). For the second measurement nothing is applied during the same period.

The difference between the spectra obtained by these two measurements is now described by giving an example of a compound having the structure shown in FIG. 4. It is difficult to determine whether $C_A$-$H_A$ of this compound is coupled to $C_B$-$H_B$ through the carbon nucleus $C_C$. According to the present invention, a proton NMR spectrum has been previously obtained. The frequency $f_a$ corresponding to the peak of $H_A$ is found based on the peak of $H_A$ appearing in the spectrum. The oscillation frequency of the oscillator 11 is set equal to the frequency $f_a$. Then, measurements are made in the sequence shown in FIG. 2. The free induction decay signal FID2 obtained by the second measurement is subjected to Fourier transformation to thereby provide an NMR spectrum. It is now assumed that this spectrum has three peaks $P_a$, $P_b$, and $P_c$ corresponding to three carbon nuclei $C_A$, $C_B$, and $C_C$ respectively, as shown in FIG. 5(a). For the first measurement the weak RF radiation of the frequency $f_a$ is applied to the sample to decouple only a certain hydrogen nucleus. The application of this irradiation frequency $f_a$ breaks only weak couplings between the hydrogen nucleus $H_A$ and the carbon nuclei excluding $C_A$. Therefore, in the obtained spectrum shown in FIG. 5(b), no change can be observed in the peak $P_a$ corresponding to $C_A$ directly coupled to $H_A$, but the peaks $P_b$ and $P_c$ corresponding to $C_B$ and $C_C$ weakly bonded to $H_A$ undergo changes due to the decouplings. Then the difference between the spectra shown in FIG. 5(a) and (b) is made to thereby produce a difference spectrum shown in FIG. 5(c), where the peak $P_a$ which has undergone no change is not found. Only the changed portions of the peaks $P_b$ and $P_c$ remain. Accordingly, the comparison between this spectrum and either a completely decoupled spectrum as shown in FIG. 5(d) or the spectrum shown in FIG. 5(a) clearly shows which of the carbon nuclei had a long-range coupling with the hydrogen nucleus $H_A$.

According to the invention, the signal FID2 whose sign is reversed is added to the signal FID1 by making use of the accumulation function that the NMR spectrometer has, whereby the difference is made in the form of free induction decay signal. Hence, the difference can be obtained without the necessity of special processings.

In cases where the spectrum is compared with a completely decoupled spectrum, an additional measurement would be necessary. However, when it is compared with the spectrum shown in FIG. 5(a), such an additional measurement is dispensed with by holding the signal FID2 in another memory during the accumulation.

FIG. 6 shows a measurement made of ethylbenzene having the structure shown in FIG. 7, in accordance with the invention. FIG. 6(a) shows a spectrum obtained under fully decoupled condition. The peaks corresponding to the carbon atoms at positions indicated by the numerals in FIG. 7 are given the corresponding numerals. FIG. 6(b) shows a spectrum derived by decoupling only the hydrogen atom coupled to the carbon atom at position 7. FIG. 6(c) shows a spectrum obtained by decoupling only the hydrogen atom coupled to the carbon atom at position 8. It can be seen from these spectra that the peaks indicated by the arrows varied.

Instead of adding the inversion of FID2 to the signal FID1 after obtaining the signal FID2, the phases of the RF waves contained in the 90° and 180° pulses for the second measurement may be reversed with respect to those of the 90° and 180° pulses for the first measurement shown in FIG. 2(a). In this case, the signal FID2 is received with its phase reversed and so it is added to the signal FID1 as it is.

The weak RF radiation for decoupling only a certain hydrogen nucleus may be shifted at time intervals as shown in FIG. 2(c'). Also, irradiation may be applied as pulses during time intervals which encompass the 180° pulses as shown in FIG. 2(c''). In either case, the result obtained is the same as in the case of FIG. 2(c). It is also to be noted that the application of the noise-modulated RF irradiation is not always required.

In addition, the exciting pulse train shown in FIG. 2(a) may be replaced with other various pulse trains, such as the pulse train shown in FIG. 8. FIG. 8(a) shows the time intervals during which an exciting pulse train is applied to carbon nuclei. FIG. 8(b) shows time intervals during which a strong, decoupling pulse train is supplied to hydrogen nuclei. FIG. 8(c) shows the time intervals during which weak RF irradiation for decoupling only a certain n nucleus is applied. Furthermore, different pulse trains may be used for the two measurements, as long as they produce substantially the same free induction decay signals.

Let us assume that the coupling constant between $C_A$ and $H_A$ is 125 to 200 Hz, the coupling constant between $C_B$ and $H_A$ is 10 to 20 Hz, and the coupling constant between $C_C$ and $H_A$ is about 1 Hz. That is, these constants assume widely different values. As a modified example of the present invention, the time interval $\tau$ contained in the sequence shown in FIG. 2(a) can be appropriately adjusted to obtain either the coupling between $H_A$ and $C_B$ or the coupling between $H_A$ and $C_C$. As an example, if the time interval $\tau$ is set equal to the reciprocal of the coupling constant $J_{CC-HA}$ between $C_C$ and $H_A$ (i.e., $1/J_{CC-HA}$), a spectrum as shown in FIG. 5(c) is obtained in accordance with the invention. Thus, the information about the change in the coupling between $H_A$ and $C_B$ is made quite scanty, and the information regarding the change in the coupling between $H_A$ and $C_C$ prevails.

In the above description, the long-range coupling between hydrogen and carbon nuclei was given as an example, but the present invention is not limited to this. For example, the invention can be similarly applied to the coupling between hydrogen and nitrogen ($^{15}N$) nuclei. Further, the invention can be applied to a measurement where certain nuclei of one nuclear species (e.g. protons) are selectively decoupled while the nuclei of the same nuclear species are being observed.

We claim:

1. A one-dimensional method for nuclear magnetic resonance spectroscopy in which a sample is placed in a static magnetic field comprising the steps of:

(a) applying to the sample a pulse train of radio-frequency having the resonance frequency of a nucleus under observation;

(b) in synchronism with the application of at least a part of the pulse train applying to the sample a weak radio-frequency signal having a frequency equal to the resonance frequency of an unobserved nucleus coupled to the observed nucleus, said weak radio-frequency signal being discontinued prior to the following step;

(c) detecting a first free induction decay signal produced in a period following the last pulse of the pulse train and storing it in a memory;

(d) applying to the sample a pulse train of radio-frequency having the resonance frequency of the observed nucleus;

(e) detecting a second free induction decay signal produced in a period following the last pulse of the pulse train in step (d); and (f) combining the first and second free induction decay signals either by adding or subtracting so that by taking the Fourier transform of the combined signals, a difference spectrum is produced where peaks that are not changed are not present.

2. The method according to claim 1 wherein the pulse train of radio-frequency having the resonant frequency of the nucleus under observation comprises a 90° pulse followed by a 180° pulse and the free induction decay signal is detected after a period $\tau$ following the 180° pulse.

3. The method according to claim 2 wherein the weak radiofrequency signal is applied to the spectrum during a period including the period of application of the 180° pulse.

4. The method according to claim 3 wherein a strong noise-decoupling RF irradiation is applied during a period including the periods in which free induction decay signals are being detected.

5. The method according to claim 3 wherein the weak radio-frequency signals are applied during the entire period while the pulse train is being applied and ceasing at the end of the last pulse in the train.

6. The method according to claim 3 wherein the weak radio-frequency signals are applied during the last pulse in the pulse train and ceasing just as the detection of the free induction decay signal is commenced.

7. The method according to claim 3 wherein the weak radio-frequency signals are applied just before, during, and just after the last pulse in the pulse train.

8. The method according to claim 1 wherein the pulse trains applied to detect first and second free induction decay signals are substantially identical and the first and second free induction decay signals are combined by substraction.

9. The method according to claim 1 wherein the pulse trains applied to detect the first and second free induction decay signals are made different such that the second free induction decay signal is phase reversed and the first and second free induction decay signals are combined by addition.

* * * * *